US012796214B2

(12) United States Patent
Kim et al.

(10) Patent No.: US 12,796,214 B2
(45) Date of Patent: Nov. 10, 2026

(54) DISPLAY APPARATUS

(71) Applicant: Samsung Display Co., Ltd., Yongin-si (KR)

(72) Inventors: Kihyun Kim, Yongin-si (KR); Younggil Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 492 days.

(21) Appl. No.: 17/984,812

(22) Filed: Nov. 10, 2022

(65) Prior Publication Data

US 2023/0171989 A1 Jun. 1, 2023

(30) Foreign Application Priority Data

Nov. 29, 2021 (KR) ........................ 10-2021-0167721

(51) Int. Cl.

| | |
|---|---|
| ***H10K 50/844*** | (2023.01) |
| ***H10D 86/40*** | (2025.01) |
| ***H10D 86/60*** | (2025.01) |
| ***H10K 59/121*** | (2023.01) |
| ***H10K 59/131*** | (2023.01) |
| ***H10K 59/38*** | (2023.01) |

(52) U.S. Cl.

CPC ......... *H10K 50/844* (2023.02); *H10D 86/441* (2025.01); *H10D 86/60* (2025.01); *H10K 59/1213* (2023.02); *H10K 59/131* (2023.02); *H10K 59/38* (2023.02)

(58) Field of Classification Search

CPC .. H10K 50/844; H10K 59/8731; H10K 59/38; H10K 59/131; H10K 59/1213; H10D 86/60; H10D 86/481; H10D 86/451; H10D 86/441

See application file for complete search history.

(56) References Cited

U.S. PATENT DOCUMENTS

| | | | | |
|---|---|---|---|---|
| 10,340,478 | B2 | 7/2019 | Kamiya | |
| 11,239,304 | B2 | 2/2022 | Park et al. | |
| 2008/0020527 | A1 | 1/2008 | Kang et al. | |
| 2014/0027722 | A1 | 1/2014 | Lee et al. | |
| 2017/0345881 | A1* | 11/2017 | Kim ..................... | G09G 3/2983 |
| 2019/0165312 | A1 | 5/2019 | Bae et al. | |

(Continued)

FOREIGN PATENT DOCUMENTS

| | | | |
|---|---|---|---|
| JP | 6818590 | B2 | 1/2021 |
| KR | 10-0468745 | B1 | 1/2005 |

(Continued)

*Primary Examiner* — Vongsavanh Sengdara

(74) *Attorney, Agent, or Firm* — Womble Bond Dickinson (US) LLP

(57) ABSTRACT

A display apparatus includes: a substrate including a display area, and a peripheral area outside the display area; a display element at the display area; a dam at the peripheral area; a supporter at the peripheral area outside of the dam; and an encapsulation layer on the display element. The encapsulation layer includes: a first inorganic encapsulation layer; a second inorganic encapsulation layer; and an organic encapsulation layer between the first inorganic encapsulation layer and the second inorganic encapsulation layer, and at least one of the first inorganic encapsulation layer and the second inorganic encapsulation layer covers at least a portion of an upper surface of the supporter.

18 Claims, 10 Drawing Sheets

(56) References Cited

U.S. PATENT DOCUMENTS

| | | | | |
|---|---|---|---|---|
| 2020/0194502 | A1* | 6/2020 | Joo | H10K 59/12 |
| 2020/0194534 | A1* | 6/2020 | Park | H10K 50/8426 |
| 2020/0295310 | A1 | 9/2020 | Moon et al. | |
| 2021/0242423 | A1* | 8/2021 | Lee | H10K 59/38 |
| 2021/0257577 | A1 | 8/2021 | Bang et al. | |
| 2021/0320165 | A1* | 10/2021 | So | H10K 59/131 |
| 2021/0384461 | A1* | 12/2021 | Kim | H10K 59/40 |
| 2022/0285441 | A1* | 9/2022 | Nakayama | G01T 1/241 |

FOREIGN PATENT DOCUMENTS

| | | | |
|---|---|---|---|
| KR | 10-2014-0013514 | A | 2/2014 |
| KR | 10-2019-0064254 | A | 6/2019 |
| KR | 10-2020-0073349 | A | 6/2020 |
| KR | 10-2020-0110505 | A | 9/2020 |
| KR | 10-2021-0075507 | A | 6/2021 |
| KR | 10-2021-0104398 | A | 8/2021 |

* cited by examiner

DISPLAY APPARATUS

CROSS-REFERENCE TO RELATED APPLICATION

This application claims priority to and the benefit of Korean Patent Application No. 10-2021-0167721, filed on Nov. 29, 2021, in the Korean Intellectual Property Office, the entire disclosure of which is incorporated by reference herein.

BACKGROUND

1. Field

Aspects of one or more embodiments of the present disclosure relate to a display apparatus.

2. Description of the Related Art

A display apparatus visually displays data. The display apparatus is used as a display part of various miniaturized products, such as mobile phones, and/or is used as a display part of various large-scale products, such as televisions.

The display apparatus may include a liquid crystal display apparatus that uses light from a backlight unit without spontaneously emitting light, or may include a light-emitting display apparatus including a display element that may spontaneously emit light. The display element may include an emission layer. The display apparatus may be formed by alternately stacking a conductive layer and an insulating layer.

The above information disclosed in this Background section is for enhancement of understanding of the background of the present disclosure, and therefore, it may contain information that does not constitute prior art.

SUMMARY

One or more embodiments of the present disclosure are directed to a display apparatus that is robust against external moisture penetration.

However, the present disclosure is not limited to the above aspects and features. Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a substrate including a display area, and a peripheral area outside the display area; a display element at the display area; a dam at the peripheral area; a supporter at the peripheral area outside of the dam; and an encapsulation layer on the display element. The encapsulation layer includes: a first inorganic encapsulation layer; a second inorganic encapsulation layer; and an organic encapsulation layer between the first inorganic encapsulation layer and the second inorganic encapsulation layer, and at least one of the first inorganic encapsulation layer and the second inorganic encapsulation layer covers at least a portion of an upper surface of the supporter.

In an embodiment, the at least one of the first inorganic encapsulation layer and the second inorganic encapsulation layer may extend in a direction from the display area to the peripheral area, and may cover the upper surface of the supporter by a half or more of a width of the supporter.

In an embodiment, the display apparatus may further include: a driving circuit at the peripheral area; and a wiring region outside the driving circuit, the wiring region including signal lines configured to supply signals to the driving circuit, and the supporter may overlap with the wiring region.

In an embodiment, the display apparatus may further include a sealing material spaced from the supporter outside the supporter, and, in a plan view, the supporter may be located between the sealing material and the dam, and the dam may be located between the display area and the supporter.

In an embodiment, the supporter may include a plurality of organic insulating layers.

In an embodiment, a lowermost layer of the plurality of organic insulating layers may include a layer having a high oxygen concentration at an interface with an insulating layer located underneath the supporter.

In an embodiment, the display apparatus may further include a color control panel on the encapsulation layer, and configured to change a wavelength of light emitted from the display element.

In an embodiment, the color control panel may include: a color filter layer on a surface of a second substrate facing the display element; a color-converting layer on the color filter layer; and an organic insulating layer between the color filter layer and the color-converting layer.

In an embodiment, the display apparatus may further include a filling layer between the color control panel and the encapsulation layer.

In an embodiment, the dam may include a plurality of dams spaced from each other, and an interval between an outermost dam from among the plurality of dams and the supporter may be greater than an interval between adjacent ones of the plurality of dams.

According to one or more embodiments of the present disclosure, a display apparatus includes: a first panel including a display element; and a second panel including a color filter. The first panel further includes: a first substrate including a display area, and a peripheral area outside the display area, the display element being located at the display area, and a pixel circuit electrically connected to the display element being located at the display area; a driving circuit at the peripheral area, and configured to supply signals to the pixel circuit; an insulating layer covering the pixel circuit and the driving circuit; a dam on the insulating layer at the peripheral area; a supporter on the insulating layer at the peripheral area, and spaced from the dam; and an encapsulation layer on the display element. The encapsulation layer includes: a first inorganic encapsulation layer; a second inorganic encapsulation layer; and an organic encapsulation layer between the first inorganic encapsulation layer and the second inorganic encapsulation layer, and at least one of the first inorganic encapsulation layer and the second inorganic encapsulation layer covers at least a portion of an upper surface of the supporter.

In an embodiment, the at least one of the first inorganic encapsulation layer and the second inorganic encapsulation layer may extend in a direction from the display area to the peripheral area, and may cover the upper surface of the supporter by a half or more of a width of the supporter.

In an embodiment, the display apparatus may further include a sealing material spaced from the supporter outside the supporter, and, in a plan view, the supporter may be located between the sealing material and the dam, and the dam may be located between the display area and the supporter.

In an embodiment, the supporter may include a plurality of organic insulating layers.

In an embodiment, an oxygen concentration of a lowermost layer from among the plurality of organic insulating layers may have a maximum at an interface with the insulating layer.

In an embodiment, the dam may include a plurality of dams spaced from each other, and an interval between an outermost dam from among the plurality of dams and the supporter may be greater than an interval between adjacent ones of the plurality of dams.

In an embodiment, a thin-film transistor of the pixel circuit and a thin-film transistor of the driving circuit may each include an oxide semiconductor.

In an embodiment, a height of the dam may be equal to a height of the supporter.

In an embodiment, the second panel may further include: a color filter layer on a surface of a second substrate facing the display element; a color-converting layer on the color filter layer; and an organic insulating layer between the color filter layer and the color-converting layer.

In an embodiment, the display apparatus may further include a filling layer between the first panel and the second panel.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
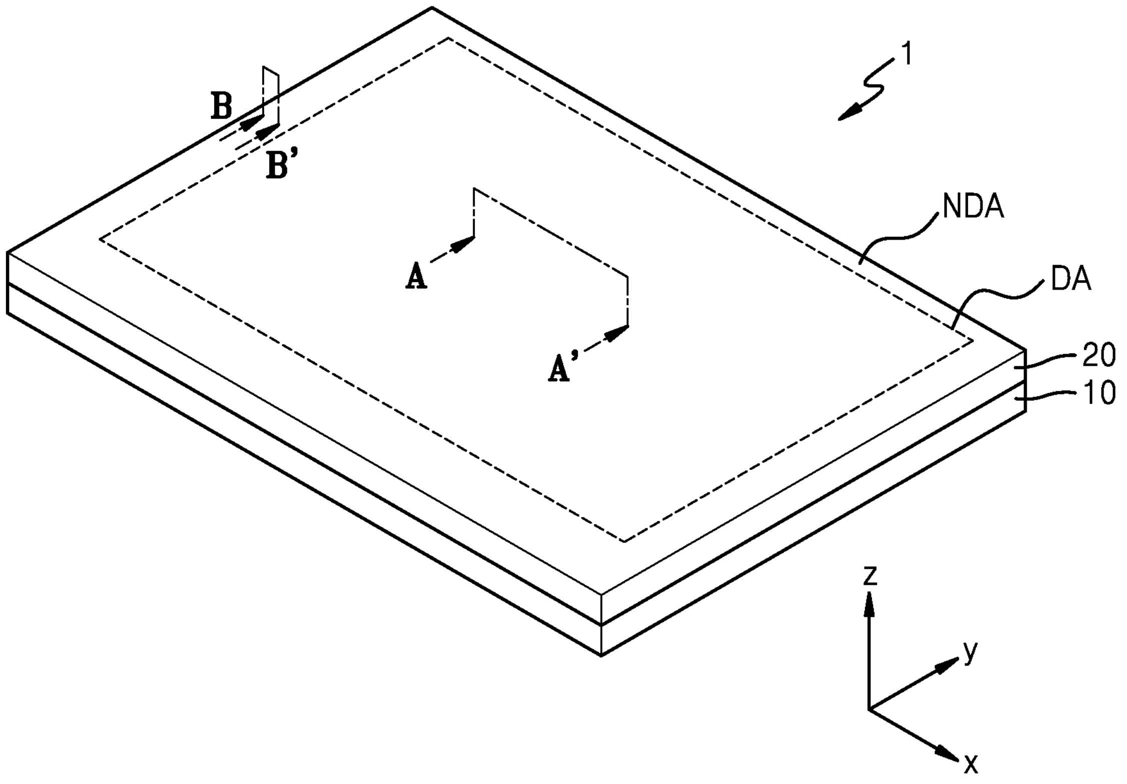
FIG. 1 is a schematic perspective view of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
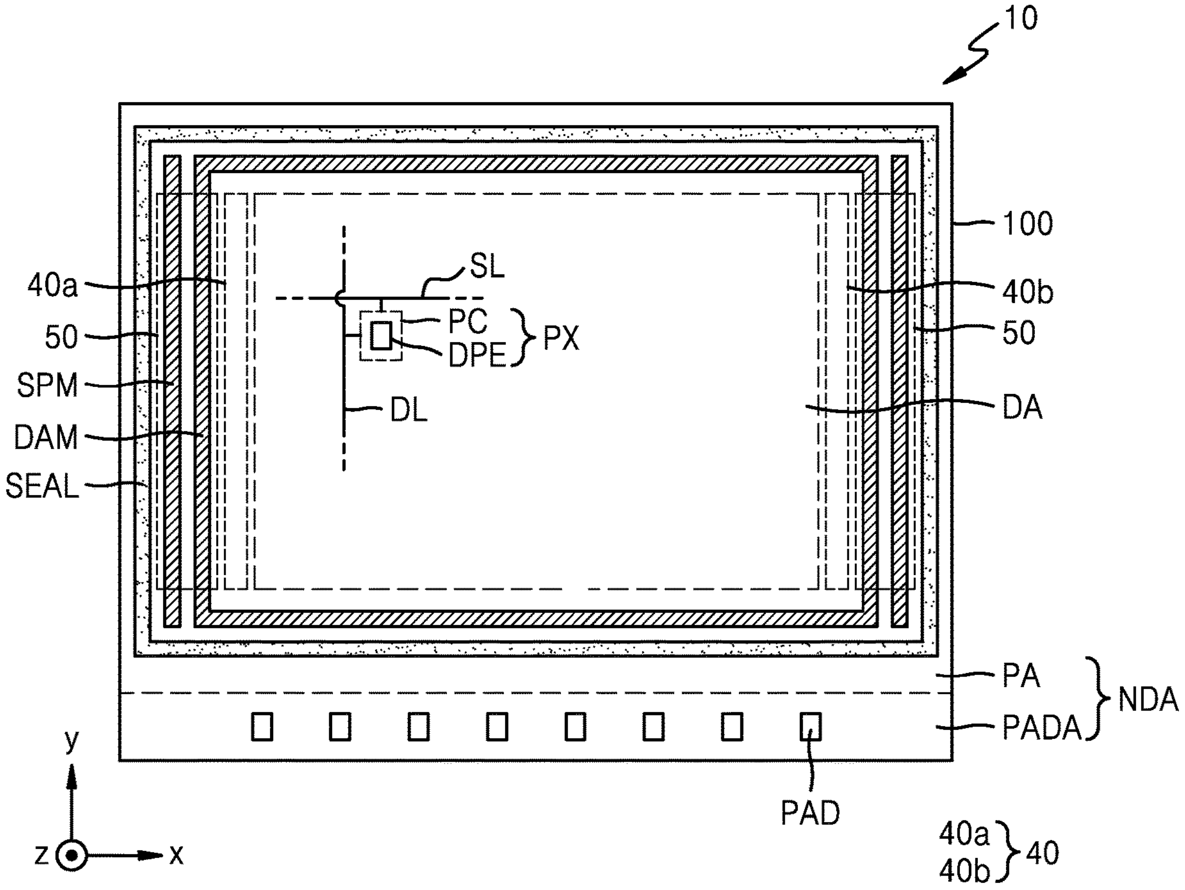
FIG. 2 is a plan view of a first panel according to an embodiment.

FIG. 1 is a schematic perspective view of a display apparatus 1 according to an embodiment. FIG. 2 is a plan view of a first panel according to an embodiment.

Referring to FIG. 1, the display apparatus 1 may display images. The display apparatus 1 may include a display area DA and a non-display area NDA. The display apparatus 1 may display images by using a plurality of pixels arranged at (e.g., in or on) the display area DA. Each of the pixels may emit light of a suitable color (e.g., a preset or predetermined color), and the display apparatus 1 may display images by using light emitted from the plurality of pixels. As an example, a pixel may emit red, green, or blue light. As another example, the pixel may emit, red, green, blue, or white light.

The non-display area NDA may surround (e.g., around a periphery of) at least a portion of the display area DA. In an embodiment, the non-display area NDA may entirely surround (e.g., around a periphery of) the display area DA. The non-display area NDA may be a region that does not display images. Pads may be arranged at (e.g., in or on) the non-display area NDA. A built-in driving circuit configured to transfer electric signals to the display area DA, various wirings, and a printed circuit board or a driving integrated circuit (IC) chip may be attached to the pads.

The display apparatus 1 may be provided in various suitable shapes. For example, the display apparatus 1 may have a rectangular shape having two pairs of sides that are parallel to or substantially parallel to each other. One of the two pairs of sides in the rectangular shape may be longer than the other pair. In the display apparatus 1 shown in FIG. 1, an extension direction of a long side thereof is denoted by a first direction (e.g., an x direction), and an extension direction of a short side thereof is denoted by a second direction (e.g., a y direction). A direction (e.g., a thickness direction) perpendicular to or substantially perpendicular to the extension directions of the long side and the short side is denoted by a third direction (e.g., a z direction). In some embodiments, at least one corner of the display apparatus 1 may have a rounded shape.

As shown in FIG. 1, the display area DA may have a suitable polygonal shape, such as a quadrangular shape, in a plan view. As an example, the display area DA may have a rectangular shape in which a horizontal length thereof is greater than a vertical length thereof, a rectangular shape in which a horizontal length thereof is less than a vertical length thereof, or a square or substantially square shape. As another example, the display area DA may have various suitable shapes, such as ellipses or circles. In some embodiments, at least one corner of the display area DA may have a rounded shape.

In an embodiment, the display apparatus 1 may include a first panel 10 and a second panel 20 that are stacked in the thickness direction (e.g., the z direction). The first panel 10 may be a display panel including the pixels (e.g., where the pixels are disposed), and the second panel 20 may be a color control panel including color filters.

Referring to FIG. 2, the first panel 10 may include a first substrate 100. The display area DA and the non-display area NDA may be defined at (e.g., in or on) the first panel 10. In an embodiment, the display area DA and the non-display area NDA may be defined in the first substrate 100. In other words, the first substrate 100 may include the display area DA and the non-display area NDA.

A plurality of pixels PX may be arranged at (e.g., in or on) the display area DA. Each pixel PX may include a pixel circuit PC, and a display element DPE connected to the pixel circuit PC. In an embodiment, a plurality of pixel circuits PC and a plurality of display elements DPE may be arranged at (e.g., in or on) the display area DA. The plurality of display elements DPE may each emit light.

The pixel circuit PC may be electrically connected to a scan line SL and a data line DL. The scan line SL may transfer scan signals, and the data line DL may transfer data signals. In an embodiment, the scan line SL may extend in the first direction (e.g., the x direction). In an embodiment, the data line DL may extend in the second direction (e.g., the y direction). The pixel circuit PC may receive a scan signal and a data signal to drive the display element DPE.

The display element DPE may be electrically connected to the pixel circuit PC to be driven by the pixel circuit PC. In an embodiment, the display element DPE may be an organic light-emitting diode including an organic emission layer. In another embodiment, the display element DPE may be a light-emitting diode LED including an inorganic emission layer. A size of the light-emitting diode LED may be in a microscale or a nanoscale. As an example, the light-emitting diode LED may be a micro light-emitting diode. As another example, the light-emitting diode LED may be a nanorod light-emitting diode. The nanorod light-emitting diode may include gallium nitride (GaN). As another example, the display element DPE may be a quantum-dot light-emitting diode including a quantum-dot emission layer.

The non-display area NDA may be a region in which the display element DPE is not arranged. The non-display area NDA may surround (e.g., around a periphery of) at least a portion of the display area DA. In an embodiment, the non-display area NDA may entirely surround (e.g., around a periphery of) the display area DA. The non-display area NDA may include a peripheral area PA and a pad area PADA.

The peripheral area PA may be adjacent to the display area DA. In an embodiment, a driving circuit and/or signal lines may be arranged at (e.g., in or on) the peripheral area PA. The driving circuit and/or the signal lines may provide electric signals or power to the pixel circuit PC. As an example, a scan driving circuit 40 may be arranged at (e.g., in or on) the peripheral area PA. The scan driving circuit 40 may apply scan signals to corresponding ones of the pixel circuits PC through the scan line SL, and the pixel circuits PC may drive the pixels PX. The scan driving circuit 40 may include a first scan driving circuit 40*a* and a second scan driving circuit 40*b* on the left side and the right side, respectively, of the display area DA. The first scan driving circuit 40*a* and the second scan driving circuit 40*b* may face each other, and may be parallel to or substantially parallel to (or approximately parallel to) each other. The peripheral area PA may include a wiring region 50 outside the first scan driving circuit 40*a* and the second scan driving circuit 40*b*. Signal lines to transfer signals (e.g., clock signals, constant voltage signals, and/or the like) for driving the first scan driving circuit 40*a* and the second scan driving circuit 40*b* are arranged at (e.g., in or on) the wiring region 50. While FIG. 2 shows that the first scan driving circuit 40*a* and the second scan driving circuit 40*b* are arranged on two opposite sides, respectively, of the display area DA, the present disclosure is not limited thereto. For example, in some embodiments, one of the first scan driving circuit 40*a* or the second scan driving circuit 40*b* may be omitted, such that only one scan driving circuit may be arranged on only one side of the display area DA.

The pad area PADA may be arranged outside the peripheral area PA. While FIG. 2 shows that the pad area PADA is arranged outside and below the peripheral area PA in the first direction (e.g., in a −y direction), in other embodiments, the pad area PADA may be arranged outside and above the peripheral area PA in the first direction (e.g., in a +y direction), outside and below the peripheral area PA in the first direction (e.g., in the −y direction), and/or outside the peripheral area PA in the second direction (e.g., in a +x direction and/or in a −x direction).

A dam DAM may be arranged at (e.g., in or on) the peripheral area PA. The dam DAM may surround (e.g., around a periphery of) at least a portion of the display area DA. In an embodiment, the dam DAM may entirely surround (e.g., around a periphery of) the display area DA. The dam DAM may have a shape protruding from the first substrate 100 in the thickness direction (e.g., the z direction). An encapsulation layer may be arranged on the display element DPE. The encapsulation layer may include at least one inorganic encapsulation layer and at least one organic encapsulation layer to prevent or substantially prevent a deterioration of the display element DPE. In an embodiment, a material for forming the organic encapsulation layer may be limited (e.g., may be prevented from flowing over to other areas), such that the material is arranged at (e.g., in or on) a suitable region (e.g., a predetermined region or a region set in advance), while the organic encapsulation layer is formed. Accordingly, in some embodiments, to contain the material of the organic encapsulation layer in the suitable region, the dam DAM may be provided at (e.g., in or on) the peripheral area PA.

While FIG. 2 shows for convenience of illustration that one dam DAM surrounds (e.g., around a periphery of) the display area DA, in some embodiments, one or more dams DAM may surround (e.g., around a periphery of) the display area DA. In the case where a plurality of dams DAM are included, the plurality of dams DAM may be spaced apart from each other, and may entirely surround (e.g., around a periphery of) the display area DA. As an example, a dam (e.g., a first dam) DAM that is relatively farther away from the display area DA may be arranged to surround (e.g., around a periphery of) a dam (e.g., another dam or a second dam) DAM that is relatively closer to the display area DA.

A supporter SPM may be further arranged at (e.g., in or on) the peripheral area PA. The supporter SPM may support a mask used during a mask process. In other words, the supporter SPM of the first panel 10 may engage a mask supporter that is provided on one side of a mask to support the mask. The supporter SPM may be arranged outside the dam DAM to be parallel to or substantially parallel to at least a portion of the dam DAM. In an embodiment, the supporter SPM may extend in a straight or substantially straight line in the first direction (e.g., the y direction) along an extended portion of the dam DAM. At least a portion of an upper surface of the supporter SPM may be covered by an inorganic insulating layer including at least one layer. In a comparative example, moisture may move below the supporter SPM due to moisture penetration by cracks in an outer portion of the display apparatus. Accordingly, device characteristics, such as a capacitance between the driving circuit and the wirings in the wiring region under the supporter SPM, may be changed, and thus, a display quality may be deteriorated.

In comparison, according to an embodiment of the present disclosure, at least a portion of the supporter SPM is covered by an inorganic insulating layer, and the supporter SPM may be arranged outside of the dam DAM between a sealing material (e.g., a sealing member) SEAL and the dam DAM (e.g. at an outermost portion of the substrate except where the sealing material SEAL is located), while the supporter SPM is located close to the driving circuit of the first panel 10. Accordingly, inflow of moisture to the driving circuit and a wiring portion may be prevented or reduced. In an embodiment, the inorganic insulating layer covering the upper portion of the supporter SPM may be at least one inorganic encapsulation layer.

The dam DAM and the supporter SPM may each include an organic material. The dam DAM and the supporter SPM may be a protrusion portion of a structure protruding from the upper surface of the first substrate 100. The dam DAM and the supporter SPM may overlap with at least a portion of the wiring region 50 over (e.g., above) the wiring region 50. FIG. 2 shows an embodiment in which the first scan driving circuit 40*a* and the second scan driving circuit 40*b* are arranged between the display area DA and the dam DAM. In another embodiment, the dam DAM may overlap with at least a portion of the first scan driving circuit 40*a* and the second scan driving circuit 40*b*. In another embodiment, the dam DAM may overlap with at least a portion of the first scan driving circuit 40*a* and the second scan driving circuit 40*b*, and may also overlap with at least a portion of the wiring region 50.

The pad PAD may be arranged at (e.g., in or on) the pad area PADA. In an embodiment, the pad PAD may be provided in a plurality. The pad PAD may electrically connect various elements of the display apparatus to the first panel 10. As an example, the first panel 10 may be electrically connected to a driving chip and/or a printed circuit board through the pad PAD. The driving chip may include an integrated circuit (IC). The printed circuit board may be a flexible printed circuit board (FPCB), or a rigid printed circuit board (PCB) that is rigid (e.g., hard) and not easily bent. As another example, depending on the case, the printed circuit board may be a composite printed circuit board including both the rigid PCB and the FPCB. In an embodiment, a chip including an IC may be disposed on the PCB.

Figure 3:
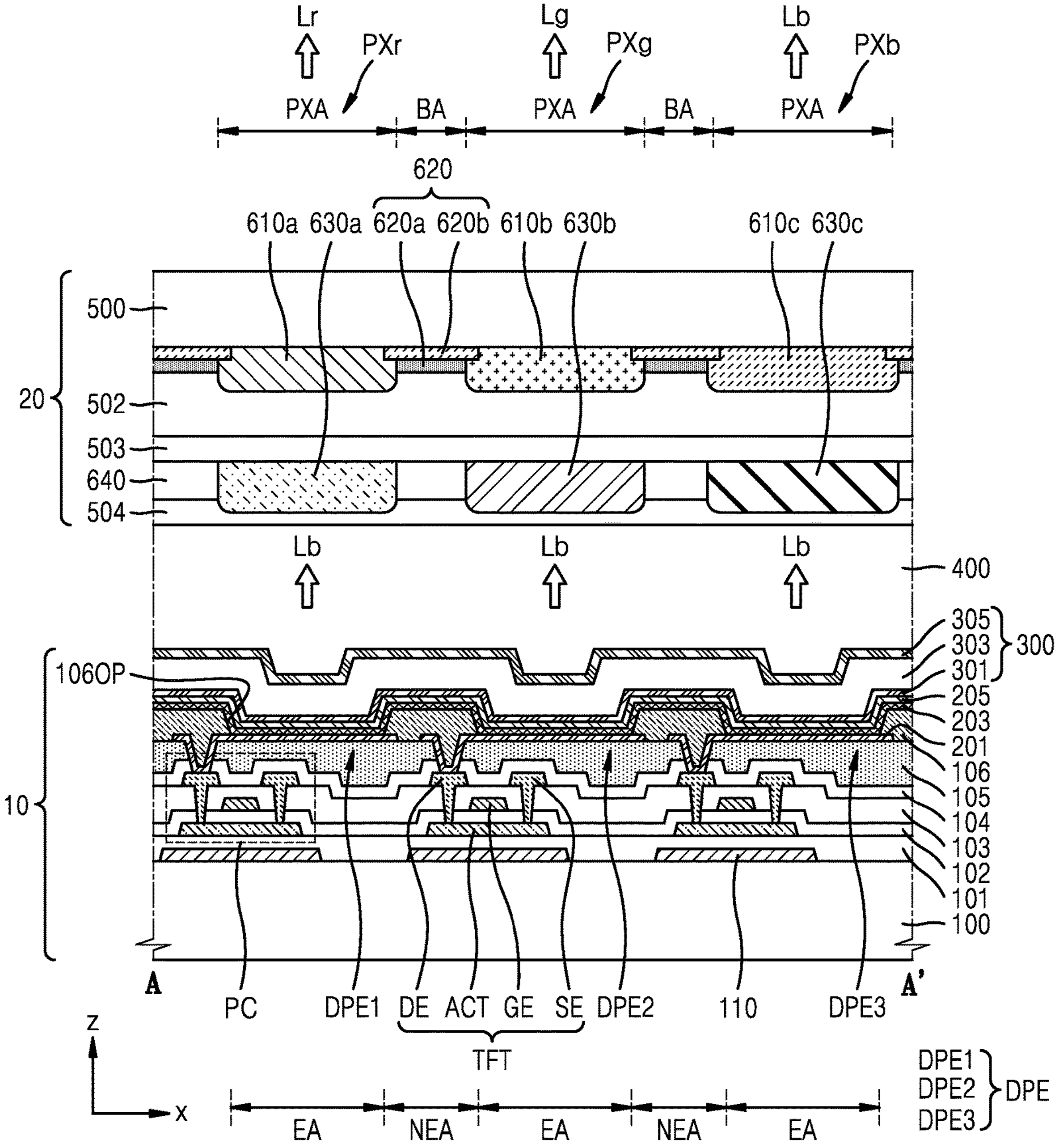
FIG. 3 is a cross-sectional view of the display apparatus taken along the line A-A' of FIG. 1.
Figure 4:
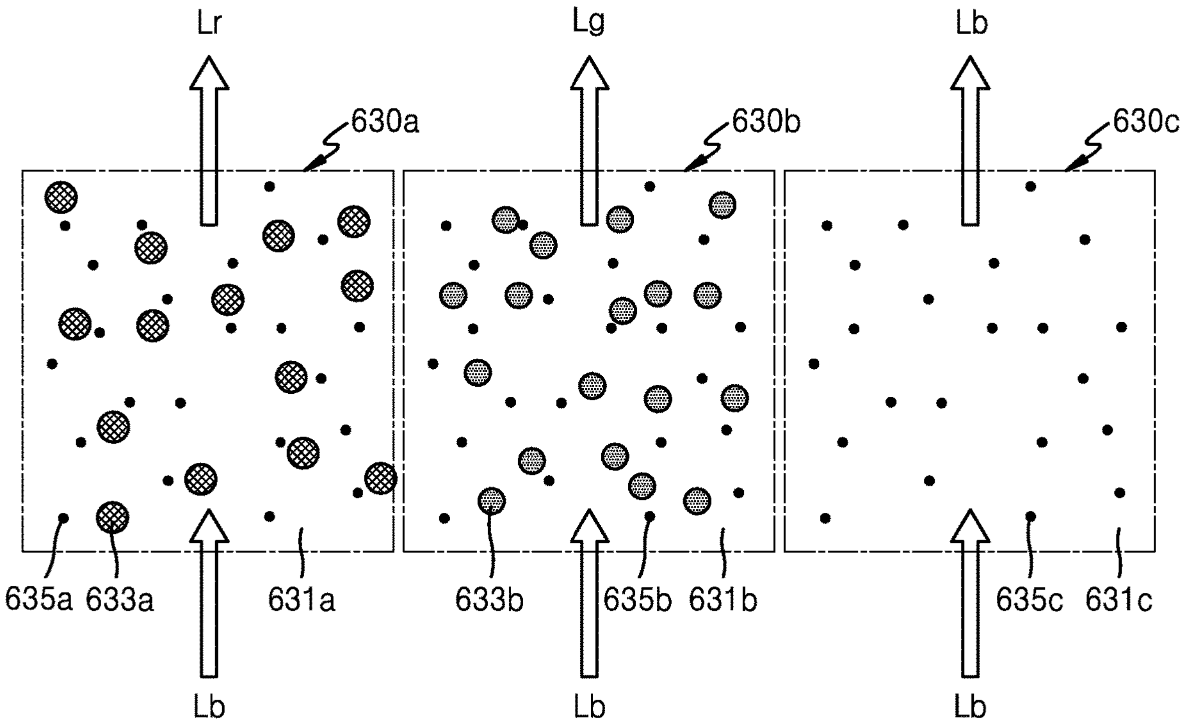
FIG. 4 is a schematic cross-sectional view of a first color-converting layer, a second color-converting layer, and a transmission layer shown in FIG. 3.
Figure 5:
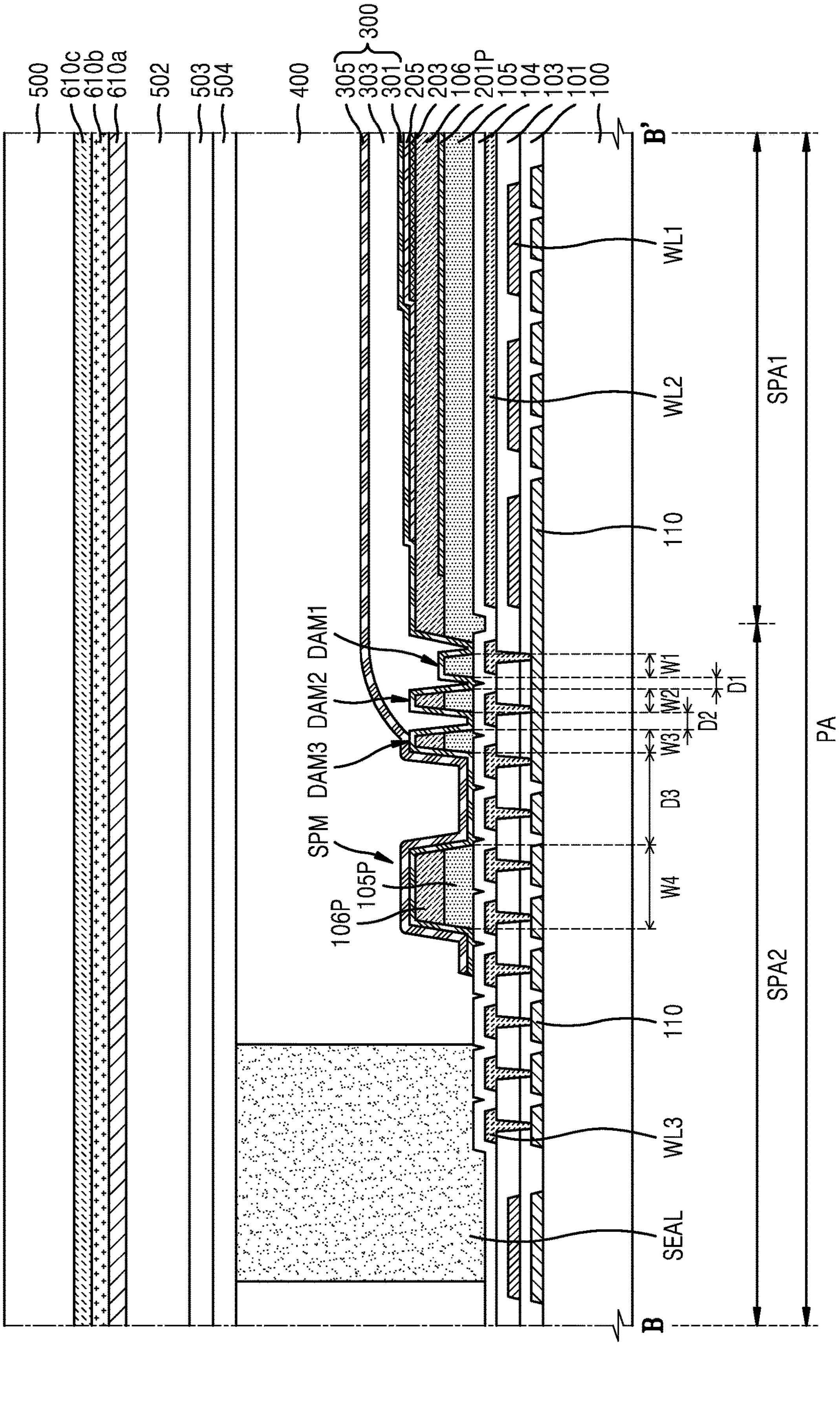
FIG. 5 is a cross-sectional view of the display apparatus taken along the line B-B' of FIG. 1.
Figure 6:
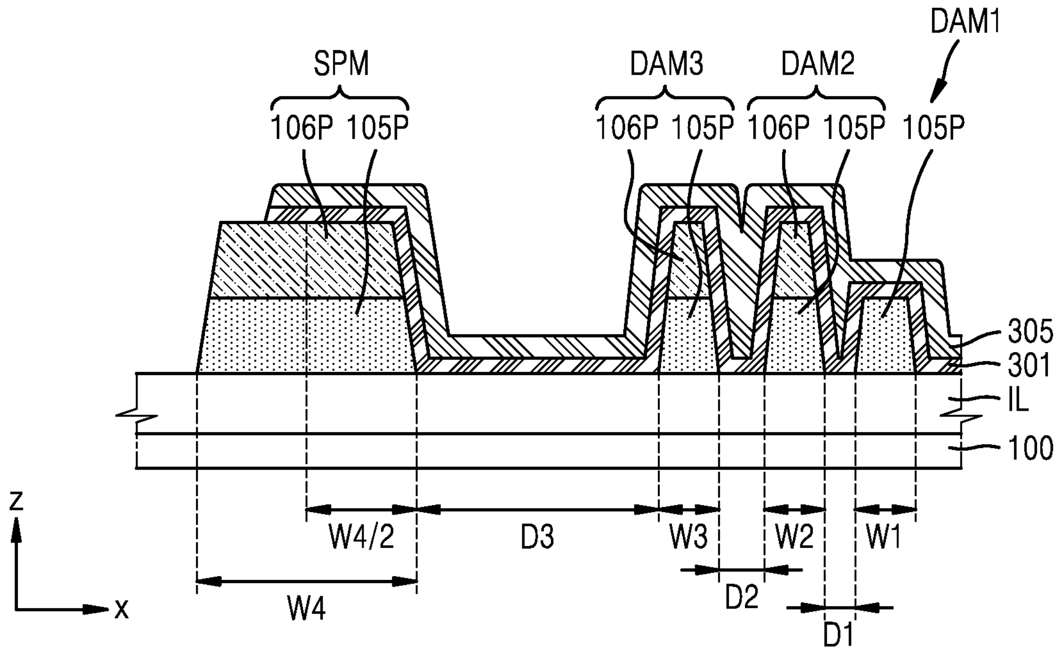
FIG. 6 is a cross-sectional view of a dam and a supporter of the display apparatus shown in FIG. 5.
Figure 7:
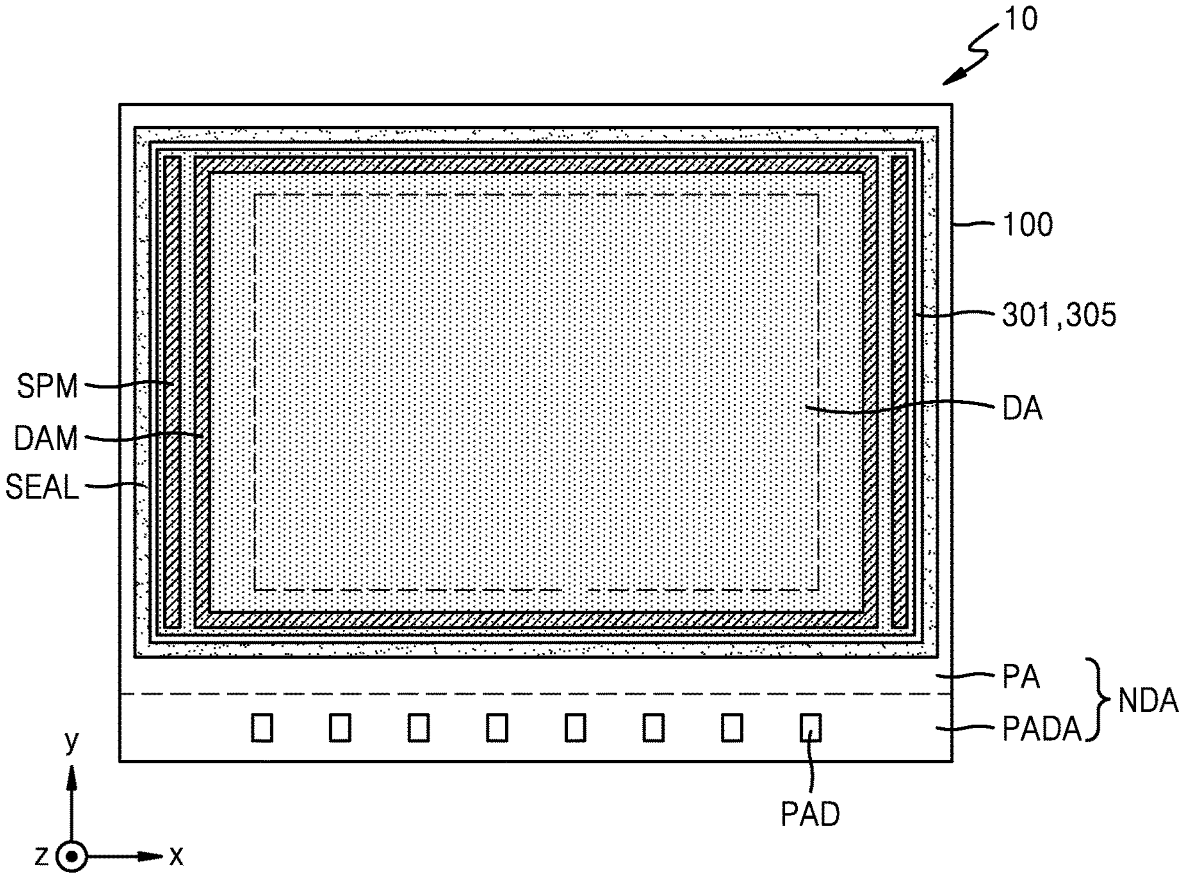
FIGS. 7-8 are schematic plan views of a first panel of a display apparatus.
Figure 8:
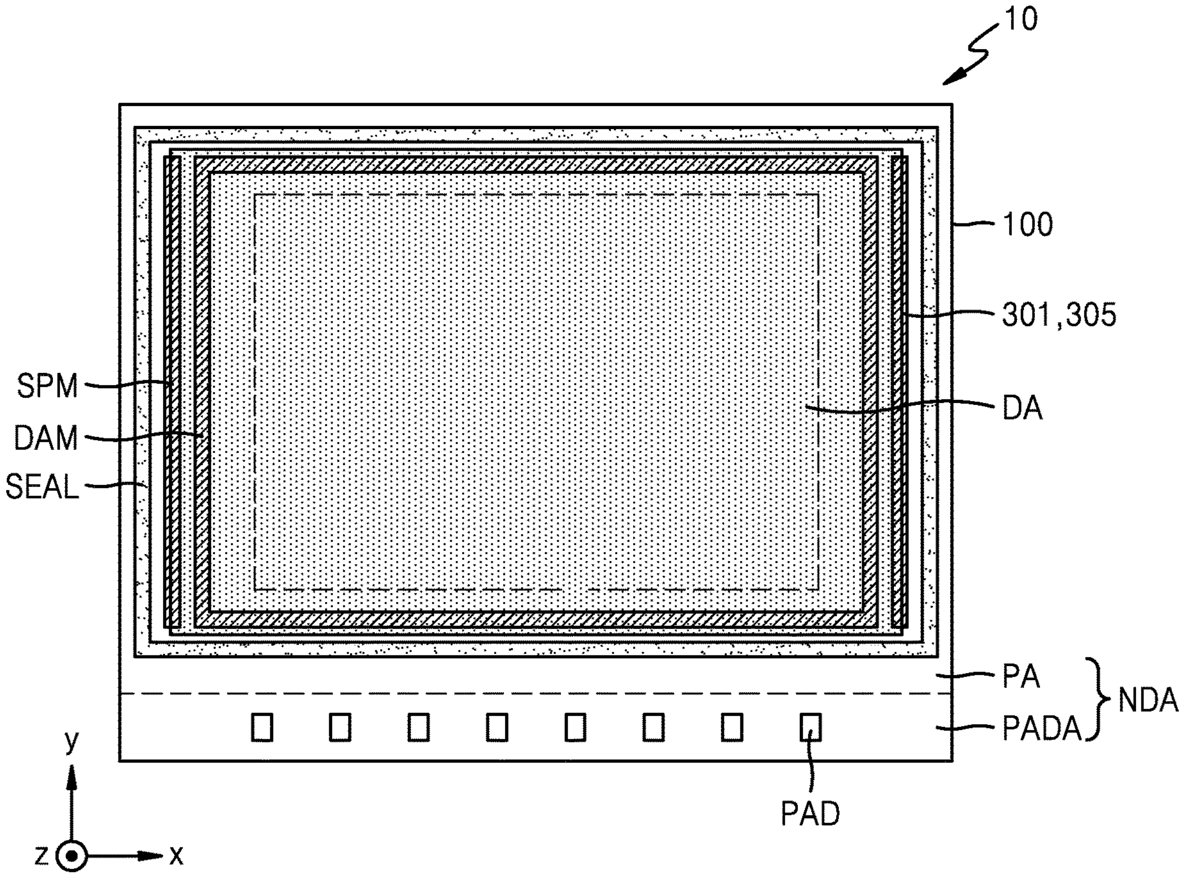

FIG. 3 is a cross-sectional view of the display apparatus 1 taken along the line A-A' of FIG. 1. FIG. 4 is a schematic cross-sectional view of a first color-converting layer, a second color-converting layer, and a transmission layer shown in FIG. 3. FIG. 5 is a cross-sectional view of the display apparatus 1 taken along the line B-B' of FIG. 1. FIG. 6 is a cross-sectional view of the dam DAM and the supporter SPM of the display apparatus 1 shown in FIG. 5. FIGS. 7 and 8 are schematic plan views of the first panel 10 of a display apparatus 1. Hereinafter, the display apparatus 1 will be described in more detail with reference to FIGS. 3 to 8.

Referring to FIG. 3, the first panel 10 may include the display element DPE arranged at (e.g., in or on) the display area DA. In an embodiment, the display element DPE may include a first display element DPE1, a second display element DPE2, and a third display element DPE3. Each of the first display element DPE1, the second display element DPE2, and the third display element DPE3 may be electrically connected to a corresponding pixel circuit PC, and may be driven by the corresponding pixel circuit PC. The display element DPE may be an organic light-emitting diode. However, the present disclosure is not limited thereto, and in another embodiment, the display element DPE may be an inorganic light-emitting diode, but various suitable modifications may be made.

The first display element DPE1, the second display element DPE2, and the third display element DPE3 may each emit light. In an embodiment, the first display element DPE1, the second display element DPE2, and the third display element DPE3 may emit the same colored light. As an example, the first display element DPE1, the second display element DPE2, and the third display element DPE3 may emit one of red light Lr, green light Lg, or blue light Lb. As another example, the first display element DPE1, the second display element DPE2, and the third display element DPE3 may emit one of red light Lr, green light Lg, blue light Lb, or white light. In another embodiment, one of the first display element DPE1, the second display element DPE2, and the third display element DPE3 may emit a different colored light from that of another of the first display element DPE1, the second display element DPE2, and the third display element DPE3. As an example, the first display element DPE1 may emit red light Lr, the second display element DPE2 may emit green light Lg, and the third display element DPE3 may emit blue light Lb. As another example, the first display element DPE1 may emit red light Lr, the second display element DPE2 may emit green light Lg, the third display element DPE3 may emit blue light Lb, and a fourth display element may be further included to emit white light. Hereinafter, for convenience, a case where all of the first display element DPE1, the second display element DPE2, and the third display element DPE3 emit blue light Lb will be mainly described in more detail.

The second panel 20 may be disposed over the first panel 10. The second panel 20 may change a wavelength of light emitted from the first panel 10. In an embodiment, the second panel 20 may be disposed on the display element DPE. The second panel 20 may change the wavelength of light emitted from the display element DPE. In an embodiment, blue light Lb emitted from the first display element DPE1, the second display element DPE2, and the third display element DPE3 may be converted to red light Lr, green light Lg, and blue light Lb, respectively, or may be transmitted while passing through the second panel 20.

A region of the display area DA of the display apparatus 1 from which red light Lr is emitted may correspond to a red pixel PXr (e.g., a first pixel). A region from which green light Lg is emitted may correspond to a green pixel PXg (e.g., a second pixel). A region from which blue light Lb is transmitted may correspond to a blue pixel PXb (e.g., a third pixel).

The second panel 20 may include a pixel area PXA and a light-blocking area BA at (e.g., in or on) the display area DA. The pixel area PXA is a region from which light is emitted, and is surrounded (e.g., around a periphery thereof) by the light-blocking area BA. The pixel area PXA may correspond to an emission area EA of the first panel 10, and may overlap with the emission area EA of the first panel 10. The light-blocking area BA may correspond to a non-emission area NEA of the first panel 10, and may overlap with the non-emission area NEA of the first panel 10. The second panel 20 may include a second substrate 500, a color filter, and a color-converting layer.

The second substrate 500 may include an insulating material, for example, such as glass, plastic, crystal, and/or the like, but is not particularly limited thereto, and the second substrate 500 may be a commonly used substrate as would be known by those having ordinary skill in the art. The second substrate 500 (e.g., a material included in the second substrate 500) may be selected considering the mechanical strength, thermal stability, transparency, surface flatness, handling ease, and/or the like thereof.

The color filter may be disposed on a surface of the second substrate 500 facing the first substrate 100. The color filter may include a first color filter layer 610*a*, a second color filter layer 610*b*, and a third color filter layer 610*c*. The first color filter layer 610*a*, the second color filter layer 610*b*, and the third color filter layer 610*c* may each include an organic material pattern including a dye or a pigment. The first color filter layer 610*a* may be arranged at (e.g., in or on) the pixel area PXA of at least the red pixel PXr. The second color filter layer 610*b* may be arranged at (e.g., in or on) the pixel area PXA of at least the green pixel PXg. The third color filter layer 610*c* may be arranged at (e.g., in or on) the pixel area PXA of at least the blue pixel PXb. The first color filter layer 610*a* may selectively transmit light of a first color (e.g., red light), the second color filter layer 610*b* may selectively transmit light of a second color (e.g., green light), and the third color filter layer 610*c* may selectively transmit light of a third color (e.g., blue light). The first color filter layer 610*a*, the second color filter layer 610*b*, and the third color filter layer 610*c* may be formed by a repeated process of patterning by coating a color photoresist on the second substrate 500, and then selectively etching the color photoresist. A forming order of the first color filter layer 610*a*, the second color filter layer 610*b*, and the third color filter layer 610*c* is not particularly limited. In an embodiment, as shown in FIG. 5, the color filter may be formed in an order of the third color filter layer 610*c*, the second color filter layer 610*b*, and the first color filter layer 610*a* relative to the second substrate 500. In another embodiment, the color filter may be formed in an order of the third color filter layer 610*c*, the first color filter layer 610*a*, and the second color filter layer 610*b* relative to the second substrate 500.

A light-blocking member 620 may be arranged at (e.g., in or on) the light-blocking area BA between the pixel areas PXA (e.g., between adjacent pixel areas PXA). The light-blocking member 620 may include a first light-blocking member 620*a* and a second light-blocking member 620*b*. The light-blocking member 620 may prevent or substantially prevent light from being emitted to the outside, and thus, may prevent or substantially prevent light leakage from occurring through the light-blocking area BA. The first light-blocking member 620*a* may include various suitable materials that may absorb light, for example, such as a black resin and/or the like. The first light-blocking member 620*a* may include an opaque inorganic insulating material or an opaque organic insulating material. The second light-blocking member 620*b* may be disposed between the second substrate 500 and the first light-blocking member 620*a*. The second light-blocking member 620*b* may be formed by using a material for forming the third color filter layer 610*c* during a process of forming the third color filter layer 610*c*. In this case, the second light-blocking member 620*b* that is adjacent to the third color filter layer 610*c* may be formed as one body (e.g., may be integrally formed) with the third color filter layer 610*c*.

The color-converting layer may be disposed on the color filter. The color-converting layer may include a first color-converting layer 630*a*, a second color-converting layer 630*b*, and a transmission layer 630*c*. Each of the first color-converting layer 630*a*, the second color-converting layer 630*b*, and the transmission layer 630*c* may be formed in an indented space defined by partition walls 640 using an inkjet method. The partition wall 640 may be arranged to correspond to the light-blocking area BA.

The first color-converting layer 630*a* may overlap with the first color filter layer 610*a*, and may convert blue light Lb incident thereto to red light Lr. As shown in FIG. 4, the first color-converting layer 630*a* may include a first photosensitive polymer 631*a*, first quantum dots 633*a*, and first scattering particles 635*a*. The first quantum dots 633*a* and the first scattering particles 635*a* may be dispersed in the first photosensitive polymer 631*a*.

The first quantum dots 633*a* may be excited by the blue light Lb, and may emit the red light Lr having a greater wavelength than the wavelength of the blue light Lb. The first photosensitive polymer 631*a* may include (e.g., may be) an organic material having a suitable light transmittance. The first scattering particles 635*a* may increase a color-converting efficiency by scattering the blue light Lb that is not absorbed in the first quantum dots 633*a*, and allowing more of the first quantum dots 633*a* to be excited. The first scattering particles 635*a* may include, for example, titanium oxide ($TiO_2$), metal particles, or the like. The first quantum dots 253*a* may be one of a Group II-Group VI compound, a Group III-Group V compound, a Group IV-Group VI compound, a Group IV element, a Group IV compound, or a suitable combination thereof.

The second color-converting layer 630*b* may overlap with the second color filter layer 610*b*, and may convert blue light Lb incident thereto to green light Lg. The second color-converting layer 630*b* may include a second photosensitive polymer 631*b*, second quantum dots 633*b*, and second scattering particles 635*b*. The second quantum dots 633*b* and the second scattering particles 635*b* may be dispersed in the second photosensitive polymer 631*b*.

The second quantum dots 633*b* may be excited by the blue light Lb, and may emit the green light Lg having a greater wavelength than the wavelength of the blue light Lb. The second photosensitive polymer 631*b* may include (e.g., may be) an organic material having a suitable light transmittance. The second scattering particles 635*b* may increase a color-converting efficiency by scattering the blue light Lb that is not absorbed in the second quantum dots 633*b*, and allowing more of the second quantum dots 633*b* to be excited. The second scattering particles 635*b* may include, for example, titanium oxide ($TiO_2$), metal particles, or the like. The second quantum dots 633*b* may be one of a Group II-Group VI compound, a Group III-Group V compound, a Group IV-Group VI compound, a Group IV element, a Group IV compound, or a suitable combination thereof. A size of the quantum dot may be several nanometers, and the wavelength of light after conversion may be changed depending on the size of the quantum dot.

Blue light Lb may pass through the transmission layer 630*c*. The transmission layer 630*c* may overlap with the third color filter layer 610*c*. The transmission layer 630*c* may include a third photosensitive polymer 631*c* and third scattering particles 635*c*. The third scattering particles 635*c* may be dispersed in the third photosensitive polymer 631*c*. The third photosensitive polymer 631*c* may include, for example, an organic material having a suitable light transmittance, such as a silicon resin, epoxy resin, and/or the like. The third photosensitive polymer 631*c* may include the same material as that of the first photosensitive polymer 631*a* and/or the second photosensitive polymer 631*b*. The third scattering particles 635*c* may scatter and emit the blue light Lb, and may include the same material as that of the first scattering particles 635*a* and/or the second scattering particles 635*b*.

Light emitted from the first panel 10 may be converted to a suitable color or may be transmitted while passing through the first color-converting layer 630*a*, the second color-converting layer 630*b*, and the transmission layer 630*c*. Color purity of the light passing through the first color-converting layer 630*a*, the second color-converting layer 630*b*, and the transmission layer 630*c* may then be improved while passing through the color filter layers. As an example, the blue light Lb emitted from the first display element DPE1 may be converted and filtered to the red light Lr while passing through the first color-converting layer 630*a* and the first color filter layer 610*a*. The blue light Lb emitted from the second display element DPE2 may be converted and filtered to the green light Lg while passing through the second color-converting layer 630*b* and the second color filter layer 610*b*. The blue light Lb emitted from the third display element DPE3 may be transmitted and filtered while passing through the transmission layer 630*c* and the third color filter layer 610*c*.

A refractive layer 502 and a first protective layer 503 may be disposed between the color filter and the color-converting layer. The refractive layer 502 may increase a light-extracting efficiency of a front side of the display apparatus by changing a light path, and may improve a color shift of light emitted from the front side and light emitted from the side. The refractive layer 502 may include a light-transmissive organic material having a low refractive index. As an example, the organic material may include at least one of acryl, polyimide, polyamide, Alq3 [tris(8-hydroxyquinolinato) aluminum], and the like. The first protective layer 503 may protect the refractive layer 502, and may include a light-transmissive inorganic material, for example, such as silicon oxide ($SiO_2$).

A second protective layer 504 may be disposed on the color-converting layer. The second protective layer 504 may cover and protect the color-converting layer and the partition wall 640. The second protective layer 504 may include a light-transmissive inorganic material, for example, such as silicon oxynitride (SiON).

The first panel 10 may include the emission area EA and the non-emission area NEA at (e.g., in or on) the display area DA. The emission area EA may be a region from which light is emitted from the display element DPE, and the non-emission area NEA may surround (e.g., around a periphery of) the emission area EA. The first panel 10 may include the first substrate 100, the pixel circuit PC, and the display element DPE.

The first substrate 100 may include an insulating material, for example, such as glass, plastic, or crystal, but is not particularly limited thereto, and the first substrate 100 may be a commonly used substrate as would be known by those having ordinary skill in the art. The first substrate 100 (e.g., a material included in the first substrate 100) may be selected considering the mechanical strength, thermal stability, transparency, surface flatness, handling ease, and/or the like thereof. In an embodiment, the first substrate 100 may include glass. In another embodiment, the first substrate 100 may include a polymer resin, for example, such as polyethersulfone, polyarylate, polyetherimide, polyethylene naphthalate, polyethylene terephthalate, polyphenylene sulfide, polyimide, polycarbonate, cellulose tri acetate, cellulose acetate propionate, and/or the like. In an embodiment, the first substrate 100 may have a multi-layered structure including a base layer and a barrier layer, each including the polymer resin. Hereinafter, for convenience, a case where the first substrate 100 includes glass is mainly described in more detail below.

A buffer layer 101 may be disposed on the first substrate 100. The buffer layer 101 may include an inorganic insulating material, for example, such as silicon nitride ($SiN_x$), silicon oxynitride (SiON), and/or silicon oxide ($SiO_2$). The buffer layer 100 may include a single layer or multi-layers including one or more of the inorganic insulating materials.

A conductive layer 110 may be arranged between the first substrate 100 and the buffer layer 101. The conductive layer 110 may be arranged to correspond to (e.g., overlap with) at least a portion of the pixel circuit PC. As an example, the conductive layer 110 may be arranged to correspond to (e.g., overlap with) at least a thin-film transistor TFT of the pixel circuit PC. In the display area DA, the conductive layer 110 may include (e.g., may be) a light-blocking layer, a signal line, and/or a voltage line. The light-blocking layer may block external light incident to the thin-film transistor TFT, and the signal line and the voltage line may transfer signals and/or voltages to the pixel circuit PC.

The pixel circuit PC may be disposed on the buffer layer 101. The pixel circuit PC may include at least one thin-film transistor TFT, and at least one capacitor. The thin-film transistor TFT may include a semiconductor layer ACT, a gate electrode GE, a source electrode SE, and a drain electrode DE.

In an embodiment, the semiconductor layer ACT may include amorphous silicon or polycrystalline silicon. In another embodiment, the semiconductor layer ACT may include an oxide semiconductor. As an example, the semiconductor layer ACT may include a Zn-oxide-based material, such as Zn-oxide, In—Zn oxide, and/or Ga—In—Zn oxide. As another example, the semiconductor layer ACT may include an In—Ga—Zn—O (IGZO), an In—Sn—Zn—O (ITZO), or an In—Ga—Sn—Zn—O (IGTZO) semiconductor containing metal, such as indium (In), gallium (Ga), and stannum (Sn) in ZnO.

A first insulating layer 102 may be disposed on the semiconductor layer ACT. The first insulating layer 102 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In this case, zinc oxide ($ZnO_x$) may include (e.g., may be) zinc oxide (ZnO) and/or zinc peroxide ($ZnO_2$). The semiconductor layer ACT may include a channel region, a source region, and a drain region. The source region and the drain region may be arranged on two opposite sides of the channel region, respectively, and include impurities.

The gate electrode GE may be disposed on the first insulating layer 102. The gate electrode GE may overlap with the channel region of the semiconductor layer ACT. The gate electrode GE may include a low-resistance metal material. The gate electrode GE may include a conductive material including molybdenum (Mo), aluminum (Al), copper (Cu), and/or titanium (Ti), and may have a single-layered structure or a multi-layered structure including one or more of the above materials.

A second insulating layer 103 may be disposed on the gate electrode GE. The second insulating layer 103 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In this case, zinc oxide ($ZnO_x$) may include (e.g., may be) zinc oxide (ZnO) and/or zinc peroxide ($ZnO_2$).

The source electrode SE and the drain electrode DE may be disposed on the second insulating layer 103. The source electrode SE and the drain electrode DE may each include a material having a high conductivity. The source electrode SE and the drain electrode DE may each include a conductive material including molybdenum (Mo), aluminum (Al), copper (Cu), and/or titanium (Ti), and may each have a single-layered structure or a multi-layered structure including one or more of the above materials. As an example, the source electrode SE and the drain electrode DE may each have a multi-layered structure of Ti/Al/Ti. The source electrode SE and the drain electrode DE may be electrically connected to the source region and the drain region, respectively, of the semiconductor layer ACT.

A third insulating layer 104 may be disposed on the source electrode SE and the drain electrode DE. The third insulating layer 104 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_x$). In this case, zinc oxide ($ZnO_x$) may include (e.g., may be) zinc oxide (ZnO) and/or zinc peroxide ($ZnO_2$).

A fourth insulating layer 105 may be disposed on the third insulating layer 104. The fourth insulating layer 105 may include an organic insulating material. As an example, the fourth insulating layer 105 may include an organic insulating material including a general-purpose polymer, for example, such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a suitable blend or combination thereof.

The display element DPE may be disposed on the fourth insulating layer 105. As shown in FIG. 3 the first display element DPE1, the second display element DPE2, and the third display element DPE3 are disposed on the fourth insulating layer 105. Each of the first display element DPE1, the second display element DPE2, and the third display element DPE3 may include a pixel electrode 201, an opposite electrode 205, and an emission layer 203 between the pixel electrode 201 and the opposite electrode 205.

The pixel electrode 201 may include a conductive oxide, which is light-transmissive, such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 201 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a suitable compound thereof. As an example, the pixel electrode 201 may have a three-layered structure of ITO/Ag/ITO.

A pixel-defining layer 106 may be disposed on the fourth insulating layer 105. An opening 1060P may be defined in the pixel-defining layer 106, the opening 1060P defining the emission area EA. A portion of the pixel electrode 201 may be exposed by the opening 1060P of the pixel-defining layer 106. The pixel-defining layer 106 may cover edges of the pixel electrode 201. In an embodiment, the pixel-defining layer 106 may include an organic insulating material. In another embodiment, the pixel-defining layer 106 may include an inorganic insulating material, for example, such as silicon nitride ($SiN_x$), silicon oxynitride (SiON), and/or silicon oxide ($SiO_2$). In another embodiment, the pixel-defining layer 106 may include an organic insulating material and an inorganic insulating material.

The emission layer 203 may be disposed in the opening 1060P of the pixel-defining layer 106. In an embodiment, the emission layer 203 may continuously extend in the display area DA. The emission layer 203 may be formed as a common layer for the plurality of pixels including, for example, the red pixel PXr, the green pixel PXg, and the blue pixel PXb. The emission layer 203 may include a polymer organic material or a low-molecular weight organic material for emitting light having a suitable color (e.g., a predetermined or preset color). In some embodiments, a first functional layer and a second functional layer may be arranged under and over the emission layer 203, respectively. The first functional layer may include, for example, a hole transport layer (HTL), or an HTL and a hole injection layer (HIL). The second functional layer is an element disposed on the emission layer 203, but may be omitted as needed or desired. The second functional layer may include, for example, an electron transport layer (ETL) and/or an electron injection layer (EIL).

In an embodiment, one display element DPE may include a plurality of emission layers that are sequentially stacked. As an example, one display element DPE may include a first emission layer and a second emission layer that are sequentially stacked. A negative charge-generating layer and a positive charge-generating layer may be arranged between the emission layers that are adjacent to each other. As an example, the negative charge-generating layer and the positive charge-generating layer may be arranged between the first emission layer and the second emission layer. In this case, one display element DPE may include the pixel electrode, the first emission layer, the negative charge-generating layer, the positive charge-generating layer, the second emission layer, and the opposite electrode, which are sequentially stacked. The negative charge-generating layer may supply electrons. The negative charge-generating layer may be an n-type electric charge-generating layer. The negative charge-generating layer may include a host and dopants. The host may include an organic material. The dopants may include metal materials. The positive charge-generating layer may be a p-type electric charge-generating layer. The positive charge-generating layer may supply holes. The positive charge-generating layer may include a host and dopants. The host may include an organic material. The dopants may include metal materials.

The opposite electrode 205 may be disposed on the emission layer 203. In an embodiment, the opposite electrode 205 may continuously extend in the display area DA. The opposite electrode 205 may be formed as a common layer for the plurality of pixels including, for example, the red pixel PXr, the green pixel PXg, and the blue pixel PXb. The opposite electrode 205 may include a conductive material having a low work function. As an example, the opposite electrode 205 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or a suitable alloy thereof. As another example, the opposite electrode 205 may further include a layer on the (semi) transparent layer, and the layer may include indium tin oxide (ITO), indium zinc oxide (IZO), zinc oxide (ZnO), or indium oxide ($In_2O_3$).

The peripheral area PA may include a first sub-peripheral area SPA1 and a second sub-peripheral area SPA2. The first scan driving circuit 40*a* and the second scan driving circuit 40*b* are arranged at (e.g., in or on) the first sub-peripheral area SPA1, and the second sub-peripheral area SPA2 corresponds to (e.g., includes) the wiring region 50 and beyond (e.g., see FIG. 2). Each of the first scan driving circuit 40*a* and the second scan driving circuit 40*b* may include a plurality of thin-film transistors and at least one capacitor. A thin-film transistor of the first scan driving circuit 40*a* and a thin-film transistor of the second scan driving circuit 40*b* may each include the same or substantially the same structure as that of the thin-film transistor TFT of the pixel circuit PC of the display area DA, and may be formed by the same or substantially the same process as a process of forming the thin-film transistor TFT.

FIG. 5 shows electrodes WL1 and WL2, and a signal line WL3. The electrodes WL1 and WL2 shown in FIG. 5 form the thin-film transistors and the capacitor of one of the first scan driving circuit 40*a* and the second scan driving circuit 40*b* (the other having the same or substantially the same structure) arranged at (e.g., in or on) the first sub-peripheral area SPA1, and the signal line WL3 is arranged at (e.g., in or on) the second sub-peripheral area SPA2. The electrode WL1 may include the same material as that of the gate electrode GE, and may be formed at (e.g., in or on) the same layer as that of the gate electrode GE of the display area DA. The electrode WL2 may include the same material as that of the source electrode SE and the drain electrode DE, and may be formed at (e.g., in or on) the same layer as that of the source electrode SE and the drain electrode DE of the display area DA. The signal line WL3 may include the same material as that of the source electrode SE and the drain electrode DE, and may be formed at (e.g., in or on) the same layer as that of the source electrode SE and the drain electrode DE of the display area DA. The electrodes WL1 and WL2 may overlap with the conductive layer 110. The signal lines WL3 may overlap with the conductive layer 110, and may be electrically connected to the conductive layer 110 to be formed as a two-layered structure. The signal lines WL3 may be electrically connected to the electrodes WL1 and WL2.

In an embodiment, the buffer layer 101, the first insulating layer 102, the second insulating layer 103, the third insulating layer 104, the fourth insulating layer 105, and the pixel-defining layer 106 may each extend to the peripheral area PA. The buffer layer 101, the first insulating layer 102, the second insulating layer 103, and the third insulating layer 104 may be inorganic insulating layers IL. The fourth insulating layer 105 and the pixel-defining layer 106 may be organic insulating layers. The buffer layer 101, the second insulating layer 103, and the third insulating layer 104 may extend to the first sub-peripheral area SPA1 and the second sub-peripheral area SPA2. The fourth insulating layer 105 and the pixel-defining layer 106 may extend to the first sub-peripheral area SPA1. In another embodiment, as shown in FIG. 5, the first insulating layer 102 may not extend to the peripheral area PA, and may be arranged at (e.g., in or on) only the display area DA. In this case, the first insulating layer 102 may be patterned to correspond to the semiconductor layer of the thin-film transistor of the scan driving circuit at (e.g., in or on) the peripheral area PA.

A conductive pattern 201P may be arranged at (e.g., in or on) the first sub-peripheral area SPA1. The conductive pattern 201P may include the same material as that of the pixel electrode 201 disposed on the fourth insulating layer 105, and is spaced apart from the pixel electrode 201. The emission layer 203 and the opposite electrode 205 of the display area DA may extend to the first sub-peripheral area SPA1.

The second sub-peripheral area SPA2 may be a region (e.g., a kind of dam region) at (e.g., in or on) which at least one dam DAM is arranged. FIG. 5 shows three dams DAM as an example. The dam DAM may have a line shape surrounding (e.g., around a periphery of) the display area DA. The dam DAM may overlap with at least a portion of the first scan driving circuit 40*a*, the second scan driving circuit 40*b*, and the wiring region 50. As an example, as shown in FIG. 5, the dam DAM may overlap with the signal lines WL3, and may be located over the signal lines WL3 at (e.g., in or on) the wiring region 50. FIG. 5 shows first to third dams DAM1, DAM2, and DAM3 according to an embodiment. However, the number of dams DAM may be variously modified as needed or desired. The first to third dams DAM1, DAM2, and DAM3 may be parallel to or substantially parallel to each other, and may be spaced apart from each other. The first to third dams DAM1, DAM2, and DAM3 may be disposed on an inorganic layer. As an example, the first to third dams DAM1, DAM2, and DAM3 may be disposed on the inorganic insulating layer including at least one of the buffer layer 101, the first insulating layer 102, the second insulating layer 103, and the third insulating layer 104.

Each of the first to third dams DAM1, DAM2, and DAM3 may include at least one organic insulating layer. The first dam DAM1 may be adjacent to the display area DA, and may be arranged along an edge of the display area DA to surround (e.g., around a periphery of) the display area DA. The first dam DAM1 may have a first width W1. As shown in FIGS. 5 and 6, the first dam DAM1 may have a single-layer structure including a first insulating pattern 105P. The second dam DAM2 may be arranged outside the first dam DAM1 along the edge of the display area DA, and may surround (e.g., around a periphery of) the first dam DAM1. The second dam DAM2 may have a second width W2. The second dam DAM2 may have a multi-layered structure including the first insulating pattern 105P, and a second insulating pattern 106P disposed on the first insulating pattern 105P. The third dam DAM3 may be arranged outside the second dam DAM2 along the edge of the display area DA, and may surround (e.g., around a periphery of) the second dam DAM2. The third dam DAM3 may have a third width W3. The third dam DAM3 may have a multi-layered structure including the first insulating pattern 105P, and the second insulating pattern 106P disposed on the first insulating pattern 105P. The first width W1, the second width W2, and the third width W3 may be the same or substantially the same as each other or may be different from one another. An interval D2 between the second dam DAM2 and the third dam DAM3 may be greater than an interval D1 between the first dam DAM1 and the second dam DAM2.

The first insulating pattern 105P may be disposed on an inorganic insulating layer IL. For example, the first insulating pattern 105P may be disposed on the third insulating layer 104. In an embodiment, the first insulating pattern 105P may include the same material as that of the fourth insulating layer 105. The first insulating pattern 105P and the fourth insulating layer 105 may be formed during the same or substantially the same process as each other. The second insulating pattern 106P may include the same material as that of the pixel-defining layer 106. The second insulating pattern 106P and the pixel-defining layer 106 may be formed during the same or substantially the same process as each other.

The supporter SPM may be further disposed at (e.g., in or on) the second sub-peripheral area SPA2. The supporter SPM may be spaced apart from the dam DAM, and may be parallel to or substantially parallel to the dam DAM. The supporter SPM may be disposed on the inorganic insulating layer IL. As an example, the supporter SPM may be disposed on the inorganic insulating layer IL including at least one of the buffer layer 101, the first insulating layer 102, the second insulating layer 103, and the third insulating layer 104. The supporter SPM may be arranged outside the dam DAM along a portion of the edge of the display area DA. The supporter SPM may have a multi-layered structure including the first insulating pattern 105P, and the second insulating pattern 106P disposed on the first insulating pattern 105P. A width W4 of the supporter SPM may be greater than the first to third widths W1, W2, and W3 of the dam DAM. An interval D3 between the supporter SPM and the third dam DAM3 may be greater than the interval D1 between the first dam DAM1 and the second dam DAM2, and the interval D2 between the second dam DAM2 and the third dam DAM3. A height of the supporter SPM may be equal to or substantially equal to heights of the second dam DAM2 and the third dam DAM3.

The supporter SPM may overlap with at least a portion of the first scan driving circuit 40*a*, the second scan driving circuit 40*b*, and the wiring region 50. For example, as shown in FIG. 5, the supporter SPM may overlap with the signal lines WL3, and may be located over the signal lines WL3 at (e.g., in or on) the wiring region 50.

The sealing material SEAL may be arranged at (e.g., in or on) the second sub-peripheral area SPA2 to surround (e.g., around peripheries of) the display area DA, the dam DAM, and the supporter SPM. The sealing material SEAL may encapsulate the display area DA including the display element DPE by bonding the first substrate 100 to the second substrate 500. A portion of the sealing material SEAL may overlap with the wiring region 50.

An encapsulation layer 300 may be disposed on the display element DPE. In an embodiment, the encapsulation layer 300 may be arranged at (e.g., in or on) the display area DA. The encapsulation layer 300 may include at least one inorganic encapsulation layer and at least one organic encapsulation layer. In an embodiment, the encapsulation layer 300 includes a first inorganic encapsulation layer 301, an organic encapsulation layer 303, and a second inorganic encapsulation layer 305, which are sequentially stacked.

The first inorganic encapsulation layer 301 may continuously extend in the display area DA and the peripheral area PA. The first inorganic encapsulation layer 301 may be arranged on the opposite electrode 205 and the dam DAM.

The organic encapsulation layer 303 may be arranged at (e.g., in or on) the display area DA. The organic encapsulation layer 303 may extend to the dam DAM. In an embodiment, an upper surface of the organic encapsulation layer 303 in the display area DA may be flat or substantially flat. The organic encapsulation layer 303 may include a polymer-based material. The polymer-based material may include an acryl-based resin, an epoxy-based resin, polyimide, and/or polyethylene. An organic material for forming the organic encapsulation layer 303 may flow from the display area DA to the peripheral area PA while the first panel 10 is being manufactured. The dam DAM may prevent or substantially prevent the organic material for forming the organic encapsulation layer 303 from flowing to an outer side of the peripheral area PA while the first panel 10 is being manufactured.

The second inorganic encapsulation layer 305 may be arranged on the organic encapsulation layer 303. The second inorganic encapsulation layer 305 may continuously extend, and may directly contact the first inorganic encapsulation layer 301 on the dam DAM. The first inorganic encapsulation layer 301 and the second inorganic encapsulation layer 305 may each include at least one inorganic material from among aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), and silicon oxynitride (SiON).

The first inorganic encapsulation layer 301 and the second inorganic encapsulation layer 305 may each be formed by various suitable methods, such as atomic layer deposition (ALD), chemical vapor deposition (CVD), sputtering (SPT), sol-gel process, pulsed laser deposition (PLD), and/or the like.

The first inorganic encapsulation layer 301 and the second inorganic encapsulation layer 305 may each cover the first to third dams DAM1, DAM2, and DAM3, and may each extend (e.g., may each be formed) to the outside of the first to third dams DAM1, DAM2, and DAM3. Because the position of the organic encapsulation layer 303 is limited (e.g., is contained) by the first to third dams DAM1, DAM2, and DAM3, a material for forming the organic encapsulation layer 303 may be prevented or substantially prevented from overflowing to the outside of the first to third dams DAM1, DAM2, and DAM3. In order for the dam DAM to limit (e.g., to contain) the position of the material for forming the organic encapsulation layer, in some embodiments, the height of the third dam DAM3 that is arranged in the outermost side from among the first to third dams DAM1, DAM2, and DAM3 is relatively higher than the height of the first dam DAM1.

At least one of the first inorganic encapsulation layer 301 and the second inorganic encapsulation layer 305 may be formed (e.g., may extend) to the outside of the first to third dams DAM1, DAM2, and DAM3 to cover at least a portion of an upper surface of the supporter SPM. At least one of the first inorganic encapsulation layer 301 and the second inorganic encapsulation layer 305 may extend to a vicinity of the sealing material SEAL. While FIGS. 5 and 7 show that the first inorganic encapsulation layer 301 and the second inorganic encapsulation layer 305 may completely cover the upper surface of the supporter SPM and extend to the vicinity of the sealing material SEAL, the present disclosure is not limited thereto. In another embodiment, as shown in FIGS. 6 and 8, at least one of the first inorganic encapsulation layer 301 and the second inorganic encapsulation layer 305 may extend from the display area DA towards the sealing material SEAL, or in other words, may extend from the display area DA to cover the upper surface of the supporter SPM by as much as half (W4/2) or more of the width W4 of the supporter SPM. In an embodiment, at least one of the first inorganic encapsulation layer 301 and the second inorganic encapsulation layer 305 may extend by 1 μm from the center of the supporter SPM in a direction from the display area DA to the sealing material SEAL. As an example, an extension range may be from about 1 μm to about 185 μm in a direction from the center of the supporter SPM to an edge of the substrate. The extension range is provided as an example, and the extension range may be variously modified depending on a distance between the supporter SPM and the sealing material SEAL. The extension ranges of the first inorganic encapsulation layer 301 and the second inorganic encapsulation layer 305 may be the same or substantially the same as each other or may be different from each other. As an example, the first inorganic encapsulation layer 301 may extend longer than the second inorganic encapsulation layer 305, and thus, the lateral surfaces of the ends of the first inorganic encapsulation layer 301 and the second inorganic encapsulation layer 305 may not coincide with each other.

The second panel 20 may be formed separately from the first panel 10, and then, may be connected to (e.g., coupled to or attached to) the first panel 10 by the sealing material SEAL. A filling layer 400 may be disposed between the first panel 10 and the second panel 20.

In a comparative example, moisture introduced from the outside of the display apparatus through the refractive layer 502, which is an organic insulating layer of the second panel 20, may pass through the supporter SPM by way of the filling layer 400, or may be introduced to the lateral surface of the supporter SPM by way of the filling layer 400, which may cause defects to the driving circuit. According to an embodiment of the present disclosure, moisture inflow may be reduced by covering at least a portion of the upper surface of the supporter SPM with at least one inorganic thin-film encapsulation layer.

Figure 9:
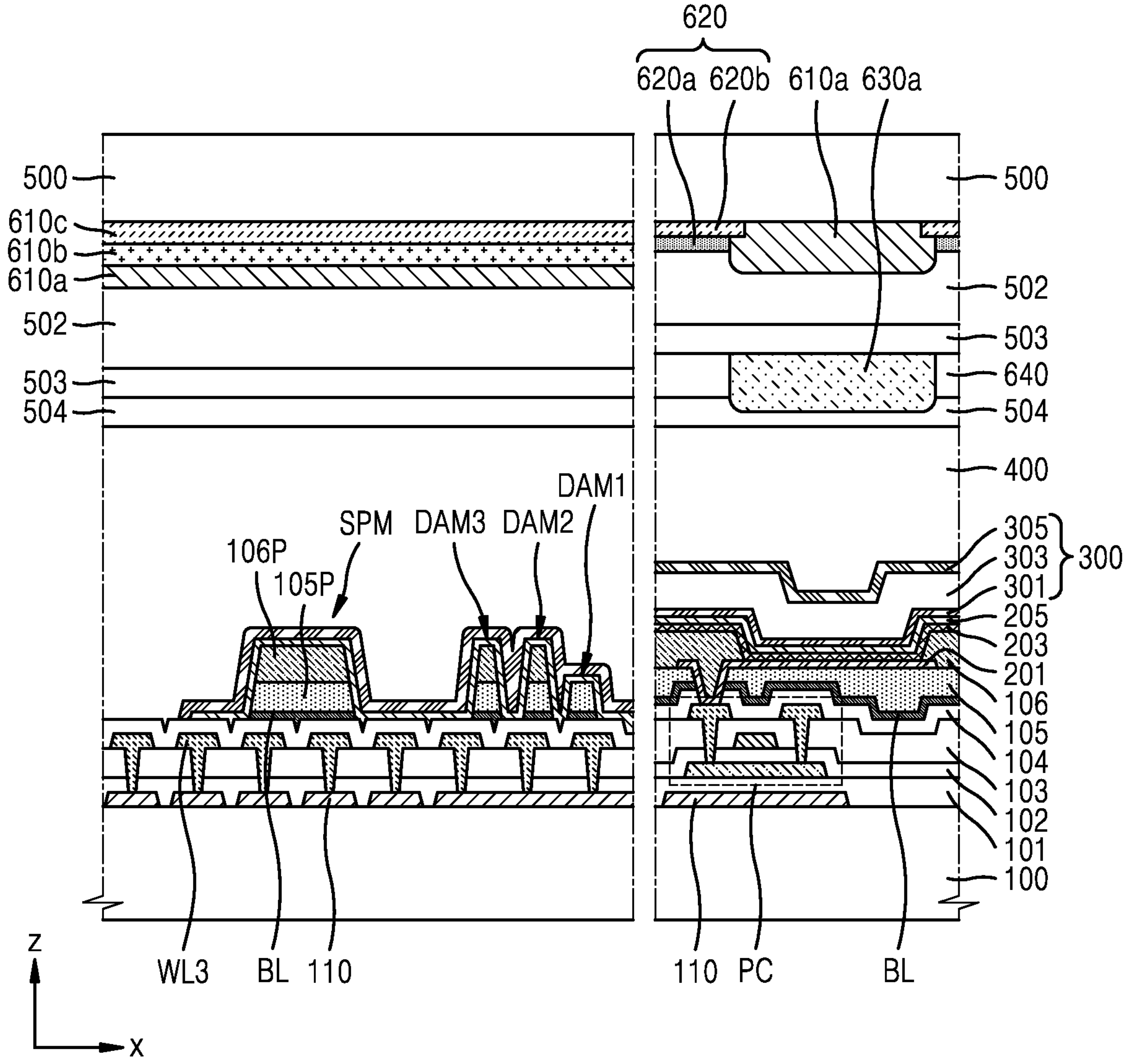
FIG. 9 is a cross-sectional view of a display apparatus according to an embodiment.

FIG. 9 is a cross-sectional view of a display apparatus according to an embodiment.

The embodiment shown in FIG. 9 may be different from the embodiments shown in FIGS. 3 and 5, in that in FIG. 9, the fourth insulating layer 105 of the display area DA of the first panel 10 and the first insulating layer 105P of the peripheral area PA may further include a barrier layer BL. In FIG. 9, the same reference numerals as those shown in FIGS. 3 and 5 are used to denote the same or substantially the same elements and members, and thus, redundant description thereof may not be repeated.

Referring to FIG. 9, in an embodiment, each of the fourth insulating layer 105 and the first insulating pattern 105P may include the barrier layer BL at an interface with the third insulating layer 104. In an embodiment, the barrier layer BL may be a high-concentration oxygen layer. The barrier layer BL may be formed by piling up oxygen at the interface with the third insulating layer 103 during heat treatment of the fourth insulating layer 105 and the first insulating pattern 105P. In this case, the oxygen may be one component of an organic material for forming the fourth insulating layer 105 and the first insulating pattern 105P. The barrier layer BL may be a portion of the fourth insulating layer 105 and the first insulating pattern 105P that has a suitable thickness (e.g., a predefined or preset thickness) of maximum oxygen concentration.

The fourth insulating layer 105 and the first insulating patterns 105P that are located over the third insulating layer 104 on the first substrate 100 may be hardened by heat treatment. Oxygen, which may be one component of the fourth insulating layer 105 and the first insulating pattern 105P, may be piled up at the interface with the third insulating layer 103 by hardening according to the heat-treatment of the fourth insulating layer 105 and the first insulating patterns 105P. Accordingly, the barrier layer BL may be formed at the interface with the third insulating layer 104 in each of the fourth insulating layer 105 and the first insulating patterns 105P.

A heat treatment temperature for hardening may be higher than room temperature. In an embodiment, the fourth insulating layer 105 and the first insulating patterns 105P may be hardened for a suitable duration (e.g., a predefined or preset duration) at a temperature that is greater than or equal to about 100° C. and less than or equal to about 300° C. The heat treatment temperature and time used for forming the barrier layer BL on the fourth insulating layer 105 and the first insulating patterns 105P may be variously adjusted depending on panel characteristics.

Because the barrier layer BL is formed on the first insulating pattern 105P, which may be the lowermost layer of the supporter SPM, a path through which moisture penetrating to the supporter SPM from the outside moves may be blocked by the barrier layer BL. Accordingly, it may be possible to reduce or prevent moisture that penetrates from the outside from moving below the supporter SPM, and influencing the driving circuit and the wirings.

Figure 10:
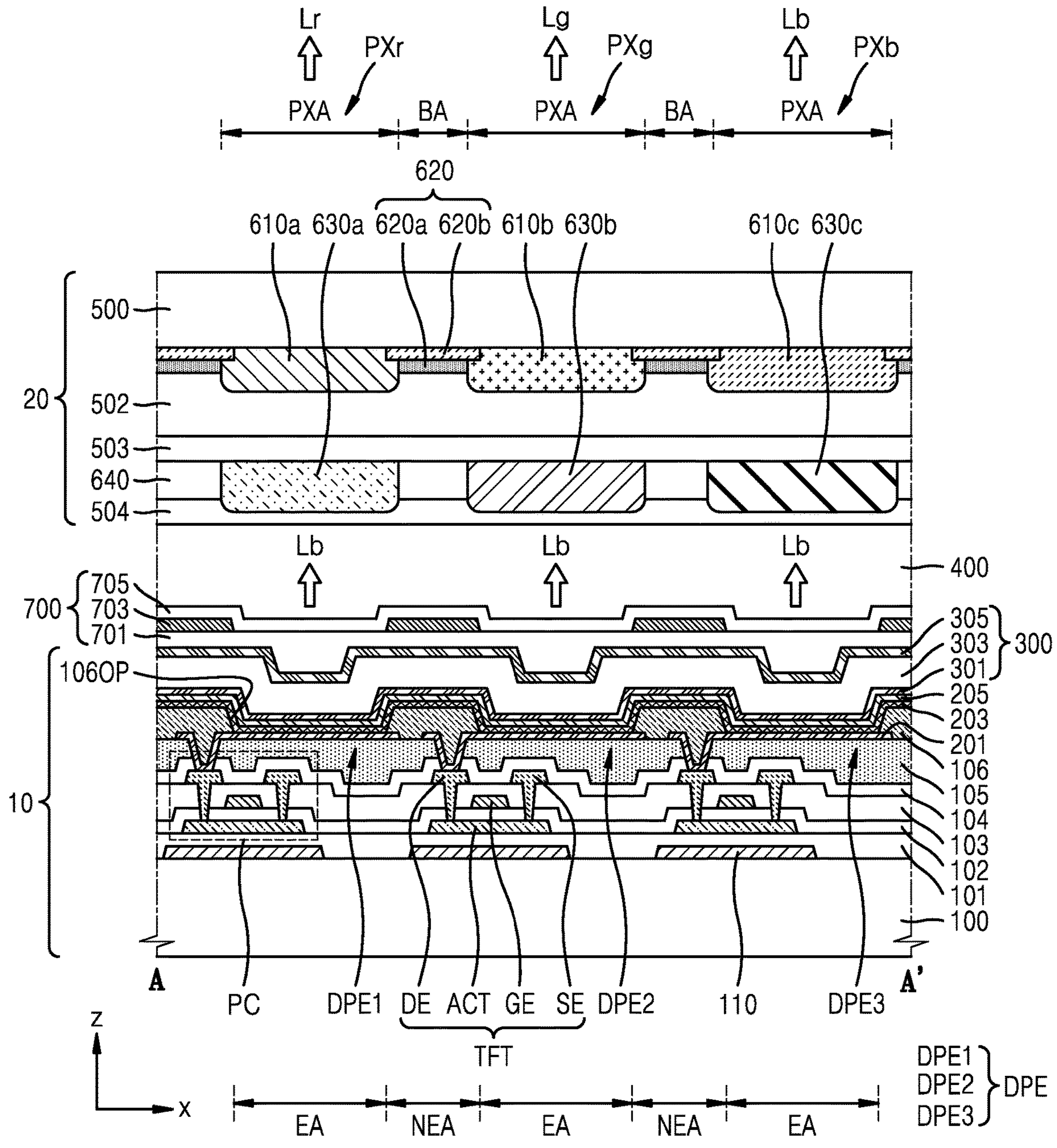
FIG. 10 is a cross-sectional view of a display apparatus according to an embodiment.

FIG. 10 is a cross-sectional view of a display apparatus according to an embodiment.

The embodiment shown in FIG. 10 illustrates the first panel 10 and the second panel 20 at (e.g., in or on) the display area DA, and may be different from the embodiment shown in FIG. 3 in that, in FIG. 10, an input sensing layer 700 is further provided between the first panel 10 and the second panel 20. In FIG. 10, the same reference numerals as those shown in FIG. 3 are used to denote the same or substantially the same elements and members, and thus, redundant description thereof may not be repeated.

Referring to FIG. 10, the input sensing layer 700 may be disposed on the encapsulation layer 300. The input sensing layer 700 may include a base layer 701, an insulating layer 705, and a sensing electrode 703 between the base layer 701 and the insulating layer 705. The sensing electrodes 703 of the input sensing layer 700 may be arranged at (e.g., in or on) the display area DA. Sensing signal lines connected to the sensing electrodes 703 may be arranged at (e.g., in or on) the peripheral area PA. In addition, as shown in FIG. 5, at least one of the first inorganic encapsulation layer 301 and the second inorganic encapsulation layer 305 may be formed to (e.g., may extend to) the outside of the first to third dams DAM1, DAM2, and DAM3 to cover at least a portion of the upper surface of the supporter SPM. In addition, as shown in FIG. 9, each of the fourth insulating layer 105, the first to third dams DAM1, DAM2, and DAM3, and the first insulating patterns 105P of the supporter SPM in the display area DA may further include the barrier layer BL at the interface with the third insulating layer 104.

The display apparatus 1 according to one or more embodiments described above may be included in mobile phones, televisions, advertisement boards, tablet personal computers, notebook computers, and the like.

Embodiments of the present disclosure may include a display apparatus that is robust against external moisture penetration, and thus, image quality deterioration may be prevented or substantially prevented. However, the aspects and features of the present disclosure are not limited to those described above.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:

a substrate including a display area, and a peripheral area outside the display area;

a display element at the display area;

a dam at the peripheral area;

a supporter at the peripheral area outside of the dam in a plan view; and an encapsulation layer on the display element, wherein the encapsulation layer comprises:

a first inorganic encapsulation layer;

a second inorganic encapsulation layer; and an organic encapsulation layer between the first inorganic encapsulation layer and the second inorganic encapsulation layer, wherein at least one of the first inorganic encapsulation layer or the second inorganic encapsulation layer covers at least a portion of an upper surface of the supporter, wherein the supporter comprises a plurality of organic insulating layer, and wherein a lowermost layer of the plurality of organic insulating layers includes a layer having a highest oxygen concentration at an interface with an insulating layer located underneath the supporter.

2. The display apparatus of claim 1, further comprising:

a driving circuit at the peripheral area; and a wiring region outside the driving circuit, the wiring region comprising signal lines configured to supply signals to the driving circuit, wherein the supporter overlaps with the wiring region.

3. The display apparatus of claim 1, further comprising a sealing material spaced from the supporter outside the supporter, wherein, in a plan view, the supporter is located between the sealing material and the dam, and the dam is located between the display area and the supporter.

4. The display apparatus of claim 1, further comprising a color control panel on the encapsulation layer, and configured to change a wavelength of light emitted from the display element.

5. The display apparatus of claim 4, wherein the color control panel comprises:

a color filter layer on a surface of a second substrate facing the display element;

a color-converting layer on the color filter layer; and an organic insulating layer between the color filter layer and the color-converting layer.

6. The display apparatus of claim 4, further comprising a filling layer between the color control panel and the encapsulation layer.

7. The display apparatus of claim 1, wherein the dam comprises a plurality of dams spaced from each other, and an interval between an outermost dam from among the plurality of dams and the supporter is greater than an interval between adjacent ones of the plurality of dams.

8. The display apparatus of claim 1, wherein the supporter is located at a same layer as that of the dam, and has a width greater than a width of the dam in a plan view.

9. The display apparatus of claim 1, wherein the at least one of the first inorganic encapsulation layer or the second inorganic encapsulation layer extends in a direction from the display area to the peripheral area, and covers the upper surface of the supporter by a half or more of a width of the supporter.

10. A display apparatus comprising:

a first panel comprising a display element; and a second panel comprising a color filter, wherein the first panel further comprises:

a first substrate comprising a display area, and a peripheral area outside the display area, the display element being located at the display area, and a pixel circuit electrically connected to the display element being located at the display area;

a driving circuit at the peripheral area, and configured to supply signals to the pixel circuit;

an insulating layer covering the pixel circuit and the driving circuit;

a dam on the insulating layer at the peripheral area;

a supporter on the insulating layer at the peripheral area, and spaced from the dam; and an encapsulation layer on the display element, wherein the encapsulation layer comprises:

a first inorganic encapsulation layer;

a second inorganic encapsulation layer; and an organic encapsulation layer between the first inorganic encapsulation layer and the second inorganic encapsulation layer, and wherein at least one of the first inorganic encapsulation layer or the second inorganic encapsulation layer covers at least a portion of an upper surface of the supporter, wherein the supporter comprises a plurality of organic insulating layers, and wherein an oxygen concentration of a lowermost layer from among the plurality of organic insulating layers has a maximum at an interface with the insulating layer.

11. The display apparatus of claim 10, further comprising a sealing material spaced from the supporter outside the supporter, wherein, in a plan view, the supporter is located between the sealing material and the dam, and the dam is located between the display area and the supporter.

12. The display apparatus of claim 10, wherein the dam comprises a plurality of dams spaced from each other, and an interval between an outermost dam from among the plurality of dams and the supporter is greater than an interval between adjacent ones of the plurality of dams.

13. The display apparatus of claim 10, wherein a thin-film transistor of the pixel circuit and a thin-film transistor of the driving circuit each include an oxide semiconductor.

14. The display apparatus of claim 13, wherein the second panel further comprises:

a color filter layer on a surface of a second substrate facing the display element;

a color-converting layer on the color filter layer; and an organic insulating layer between the color filter layer and the color-converting layer.

15. The display apparatus of claim 10, wherein a height of the dam is equal to a height of the supporter.

16. The display apparatus of claim 10, further comprising a filling layer between the first panel and the second panel.

17. The display apparatus of claim 10, wherein the supporter is located at a same layer as that of the dam, and has a width greater than a width of the dam in a plan view.

18. The display apparatus of claim 10, wherein the at least one of the first inorganic encapsulation layer or the second inorganic encapsulation layer extends in a direction from the display area to the peripheral area, and covers the upper surface of the supporter by a half or more of a width of the supporter.

* * * * *